(12) United States Patent
Chang et al.

(10) Patent No.: US 10,084,467 B1
(45) Date of Patent: Sep. 25, 2018

(54) ADC AND AN INTERFACING CIRCUIT ADAPTABLE THERETO

(71) Applicants: NCKU Research and Development Foundation, Tainan (TW); Himax Technologies Limited, Tainan (TW)

(72) Inventors: Soon-Jyh Chang, Tainan (TW); Wen-Chia Luo, Tainan (TW); Yi-Lun Chiang, Tainan (TW); Chuo-Ming Kuo, Tainan (TW)

(73) Assignees: NCKU Research and Development Foundation, Tainan (TW); Himax Technologies Limited, Tainan (TW)

( * ) Notice: Subject to any disclaimer, the term of this patent is extended or adjusted under 35 U.S.C. 154(b) by 0 days.

(21) Appl. No.: 15/861,624

(22) Filed: Jan. 3, 2018

(51) Int. Cl.
*H03M 1/12* (2006.01)
*H03M 1/38* (2006.01)

(52) U.S. Cl.
CPC ......... *H03M 1/1245* (2013.01); *H03M 1/129* (2013.01); *H03M 1/38* (2013.01)

(58) Field of Classification Search
CPC ....... H03M 1/1245; H03M 1/129; H03M 1/38
See application file for complete search history.

(56) References Cited

U.S. PATENT DOCUMENTS

| | | | |
|---|---|---|---|
| 6,731,232 B1 * | 5/2004 | Kearney | H03M 1/129 341/144 |
| 2014/0002286 A1 * | 1/2014 | Bogner | H03M 1/1225 341/122 |
| 2015/0372691 A1 * | 12/2015 | Mandal | H03M 1/1245 341/110 |

* cited by examiner

*Primary Examiner* — Howard Williams
(74) *Attorney, Agent, or Firm* — Donald E. Stout; Stout, Uxa & Buyan, LLP

(57) ABSTRACT

An interfacing circuit adaptable to an analog-to-digital converter (ADC) includes a sample and hold (S/H) circuit; an input switch; an input capacitor with a first end connected to an input end of a comparator of the ADC via the S/H circuit, and with a second end connected to receive an input signal via the input switch; a hold switch connected between the second end of the input capacitor and an original common-mode voltage; a reset switch connected between the input end of the comparator and a target common-mode voltage; and a front switch connected between the first end of the input capacitor and the target common-mode voltage.

20 Claims, 6 Drawing Sheets

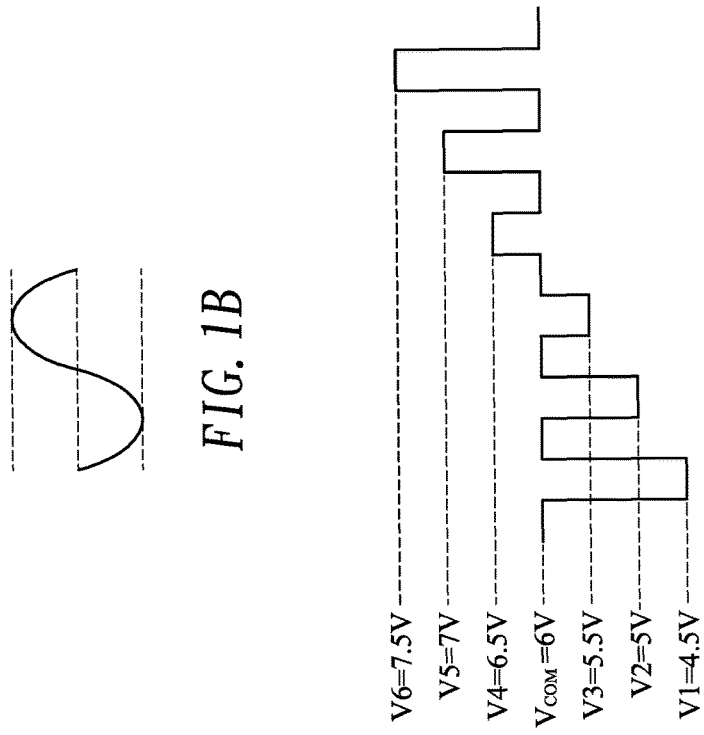
FIG. 1B
FIG. 1C
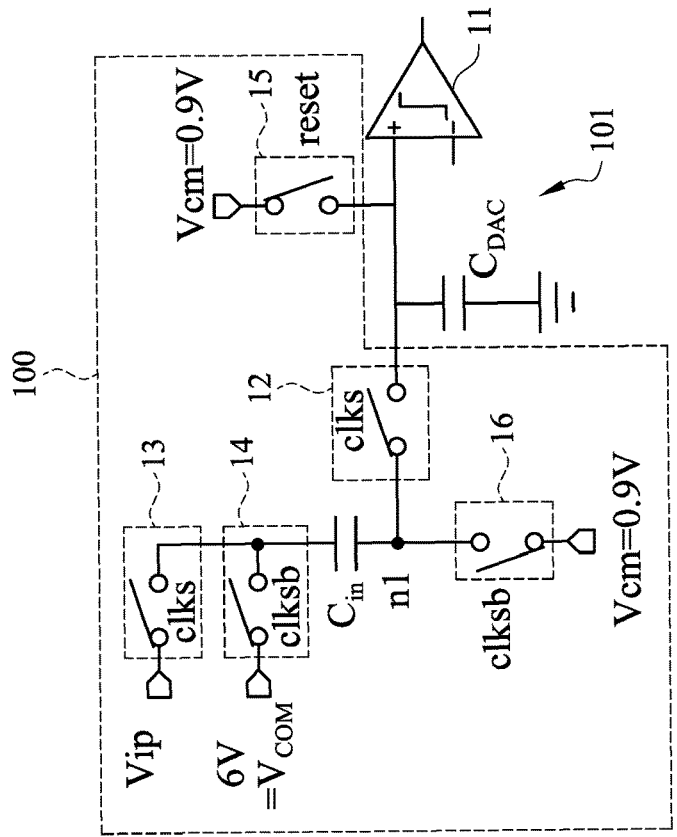
FIG. 1A

ADC AND AN INTERFACING CIRCUIT ADAPTABLE THERETO

BACKGROUND OF THE INVENTION

1. Field of the Invention

The present invention generally relates to an analog-to-digital converter (ADC), and more particularly to an interfacing circuit adaptable to the ADC.

2. Description of Related Art

An analog-to-digital converter (ADC) is a circuit that converts an analog signal into a digital signal. A resistor divider is traditionally used at an analog input of the ADC to scale the input analog signal to a dynamic range of the ADC. The resistor divider, however, suffers from high power consumption, incapability of programming the analog input range and substantial resistor size. A programmable gain amplifier (PGA) may be used to replace the resistor divider but at the cost of substantial circuit area, design complexity and power consumption for the reasons that operational amplifiers are used in the PGA.

In order to accommodate high input voltage at the analog input of the ADC, it is proposed to fabricate an entire ADC using a high-voltage process. Nevertheless, the ADC fabricated by the high-voltage process consumes significant power and occupies considerable circuit area.

A successive approximation register (SAR) ADC is a type of ADC that performs conversion by comparison and searching through all possible quantization levels to obtain a digital output. The SAR ADC requires less silicon area and lower cost than other ADC architectures, but requires more cycles to obtain the digital output.

A level shifter is proposed at the analog input of the SAR ADC to accommodate high input voltage. However, a level shifter with high linearity may even consume more power than the SAR ADC.

A resistor-capacitor (RC) high-pass filter is also proposed at the analog input of the ADC to accommodate high input voltage by means of alternating-current (AC) coupling or direct-current (DC) blocking. Nevertheless, a capacitor with large capacitance is required to pass a desired minimum desired AC signal, thereby occupying considerable circuit area. Moreover, extra power is consumed for additional bias circuits. Further, as the RC high-pass filter performs DC blocking, the signal swing varies with input frequency at low frequency. Accordingly, this scheme is not suitable for an application that has DC signal component.

For the foregoing reasons, a need has thus arisen to propose a novel scheme at the analog input of the ADC to accommodate high input voltage with simple design, less circuit area and/or lower power consumption, and is suitable for an application that has DC signal component.

SUMMARY OF THE INVENTION

In view of the foregoing, it is an object of the embodiment of the present invention to provide an interfacing circuit adaptable to an analog-to-digital converter (ADC) such as a successive approximation register (SAR) ADC that is capable of accommodating high input swing without using, for example, a programmable gain amplifier or other circuits with high power consumption or big circuit area. The ADC of the embodiment is capable of accommodating high input swing without using high-voltage devices.

According to one embodiment, an interfacing circuit adaptable to an analog-to-digital converter (ADC) includes a sample and hold (S/H) circuit, an input switch, an input capacitor, a hold switch, a reset switch and a front switch. The input capacitor has a first end connected to an input end of a comparator of the ADC via the S/H circuit, and has a second end connected to receive an input signal via the input switch. The hold switch is connected between the second end of the input capacitor and an original common-mode voltage. The reset switch is connected between the input end of the comparator and a target common-mode voltage. The front switch is connected between the first end of the input capacitor and the target common-mode voltage.

BRIEF DESCRIPTION OF THE DRAWINGS

FIG. 1A schematically shows a circuit diagram illustrated of an interfacing circuit adaptable to an input of an analog-to-digital converter (ADC) according to one embodiment of the present invention;

FIG. 1B shows an exemplary waveform of the input signal;

FIG. 1C shows an exemplary waveform at the second end of the input capacitor;

DETAILED DESCRIPTION OF THE INVENTION

Figure 2A:
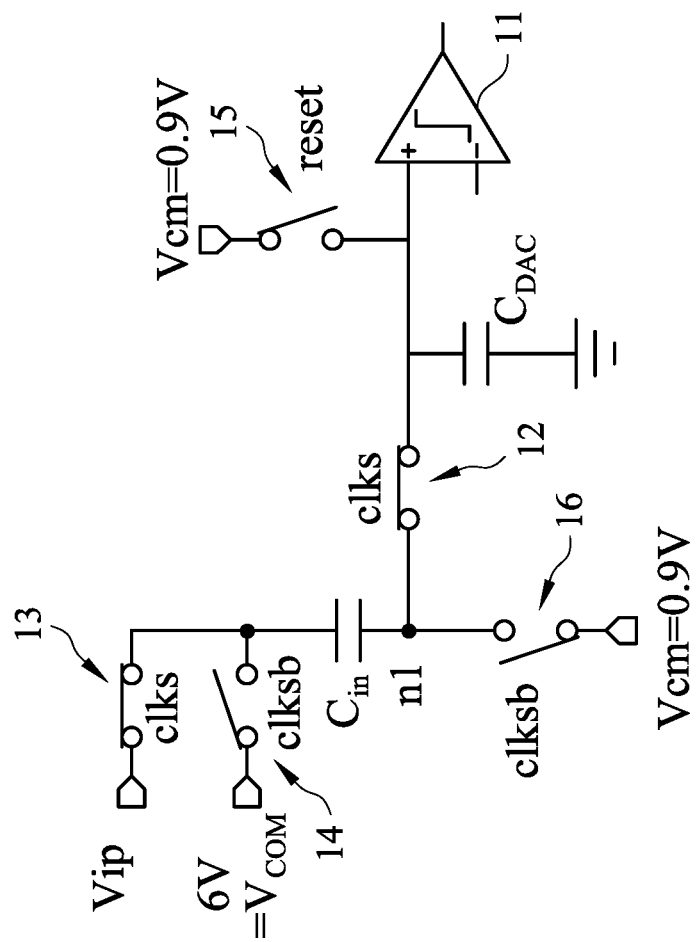
FIG. 2A shows the interfacing circuit of FIG. 1A in sampling phase.

FIG. 1A schematically shows a circuit diagram illustrated of an interfacing circuit 100 adaptable to an input of an analog-to-digital converter (ADC) 101, without using a programmable gain amplifier, according to one embodiment of the present invention. A single-ended architecture is shown in FIG. 1A, and a differential architecture can be similarly constructed and will be described in later embodiments. The ADC 101 may, for example, be adaptable to compensation on a driver of an active-matrix organic light-emitting diode (AMOLED) display panel.

In the embodiment, the ADC 101 may include a comparator 11 with a (first) input end (for example, a positive (+) input end). The ADC 101 may include a capacitor digital-to-analog converter (DAC) having an equivalent DAC capacitor $C_{DAC}$ disposed between the input end of the comparator 11 and a ground. Specifically, a first end of the DAC capacitor $C_{DAC}$ is connected to the input end of the comparator 11, and a second end of the DAC capacitor $C_{DAC}$ is connected to the ground.

The interfacing circuit 100 of the embodiment may include an input capacitor $C_{in}$ with a first end connected to the input end of the comparator 11 via a sample and hold (S/H) circuit, which may include an S/H switch 12. In this specification, the first end of the input capacitor $C_{in}$ is also called a (first) DAC node n1 with a DAC voltage $V_{DAC}$ for the reason that the node n1 is also connected to the DAC capacitor $C_{DAC}$. A second end of the input capacitor $C_{in}$ is directly connected to receive a (first) input signal Vip via an input switch 13. According to one aspect of the embodiment, there is no high-voltage (HV) (e.g., ±15 volts) device used between the input signal Vip and the input capacitor $C_{in}$. For example, HV devices such as HV metal-oxide-semiconductor (MOS) transistors are used in US Patent Application No. 2006/0001563 titled "Programmable Input Range ADC." According to current MOS technology, low voltage may refer to 5 volts or less, and high voltage may refer to 10 volts or above (e.g., 15 volts).

The interfacing circuit 100 of the embodiment may include a hold switch 14 connected between the second end of the input capacitor $C_{in}$ and a common voltage $V_{COM}$ (e.g., 6 volts). The interfacing circuit 100 of the embodiment may also include a reset switch 15 connected between the input end of the comparator 11 and a common-mode voltage Vcm (e.g., 0.9 volt), and a front switch 16 connected between the DAC node n1 and the common-mode voltage Vcm. It is noted that the S/H switch 12 and the input switch 13 are controlled by a first control signal clks; the hold switch 14 and the front switch 16 are controlled by a second control signal clksb; and the reset switch 15 is controlled by a reset signal, where the second control signal clksb is polarity opposite to the first control signal clks. FIG. 1B shows an exemplary waveform of the input signal Vip that swings between 7.5 volts and 4.5 volts, and centers on the common voltage $V_{COM}$. FIG. 1C shows an exemplary waveform at the second end of the input capacitor $C_{in}$. In the specification, $V_{COM}$ (e.g., 6 volts) may be referred to an original common-mode voltage of the input signal Vip, and Vcm (e.g., 0.9 volt) may be referred to a target common-mode voltage, which is substantially smaller than the original common-mode voltage.

Figure 2B:
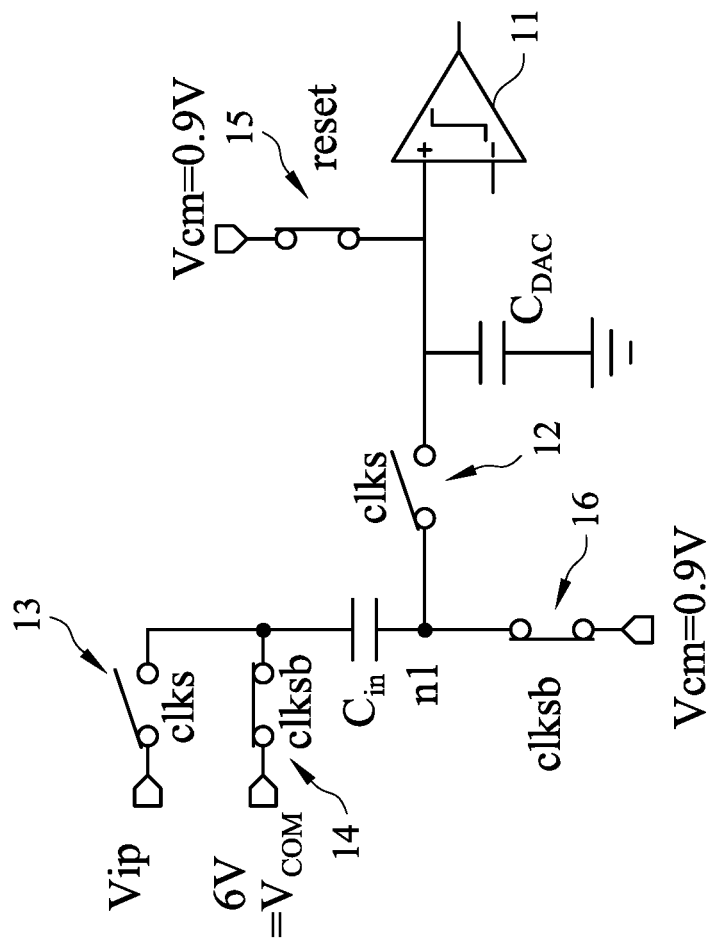
FIG. 2B shows the interfacing circuit of FIG. 1A in hold phase.
Figure 2C:
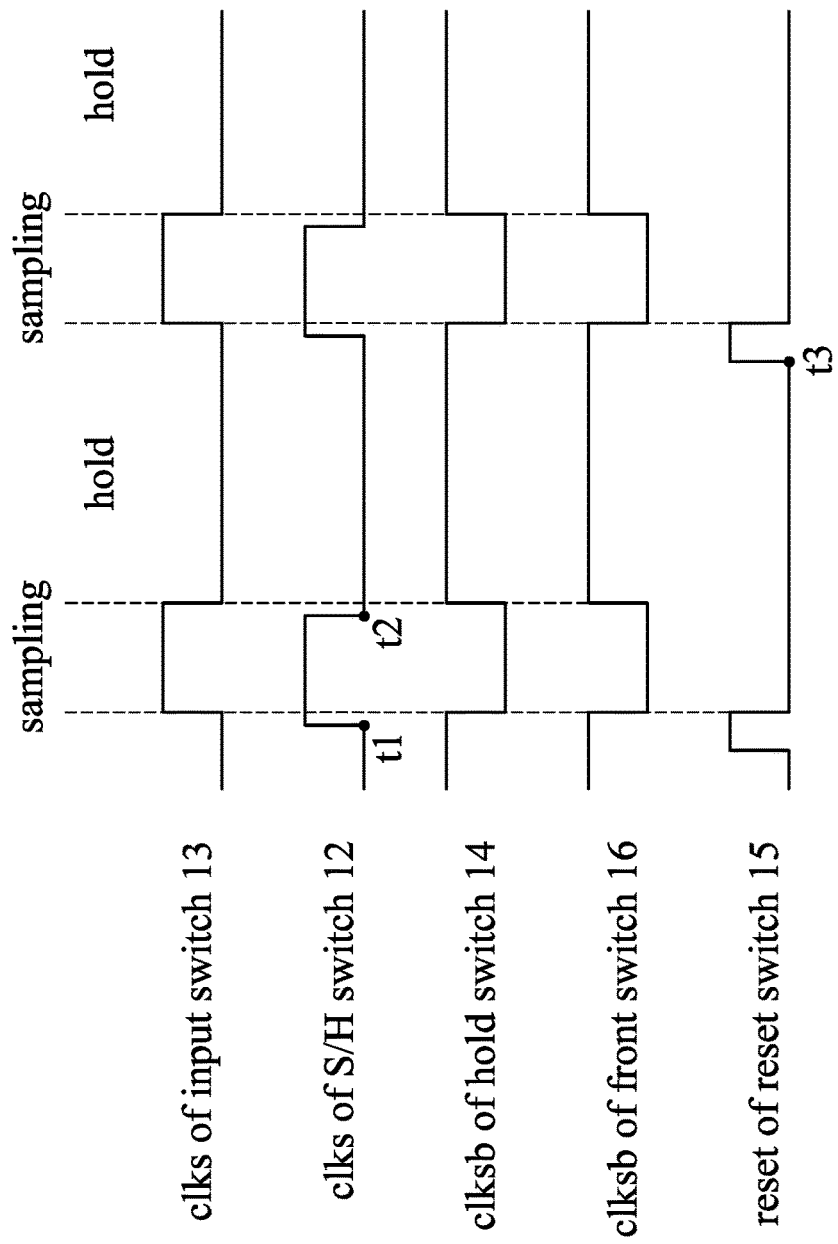
FIG. 2C shows waveforms of pertinent signals of the interfacing circuit of FIG. 1A according to one exemplary embodiment of the present invention.

FIG. 2A shows the interfacing circuit 100 of FIG. 1A in sampling phase. Specifically, in sampling phase, the S/H switch 12 and the input switch 13 are closed; and the hold switch 14, the reset switch 15 and the front switch 16 are open. It is noted that the interfacing circuit 100 in sampling phase is equivalent to a low-pass filtering circuit that allows DC signal component to pass. FIG. 2B shows the interfacing circuit 100 of FIG. 1A in hold phase. Specifically, in hold phase, the S/H switch 12 and the input switch 13 are open; the hold switch 14, and the front switch 16 are closed; and the reset switch 15 is closed when the comparator 11 finishes comparison at the end of hold phase. FIG. 2C shows waveforms of pertinent signals of the interfacing circuit 100 of FIG. 1A according to one exemplary embodiment of the present invention. It is observed that the first control signal clks of the S/H switch 12 becomes asserted (e.g., high voltage) in advance of the first control signal clks of the input switch 13. In other words, the S/H switch 12 is closed (e.g., at time t1) before the input switch 13 is closed, and the S/H switch 12 is open (e.g., at time t2) before the input switch 13 is open. It is also observed that the reset signal becomes asserted (e.g., high voltage) at the end (e.g., time t3) of hold phase to close the reset switch 15.

According to another aspect of the embodiment, a capacitance ratio of the input capacitor $C_{in}$ to the DAC capacitor $C_{DAC}$ is specifically determined such that a voltage swing (or vibration amplitude) of the DAC voltage $V_{DAC}$ at the DAC node n1 may be substantially reduced and, therefore, no high-voltage (HV) device is required between the input signal Vip and the input capacitor $C_{in}$.

In one exemplary embodiment, the voltage swing of the input signal Vip is 3 volts, which is required to be reduced to 1.8 volt in order to be compatible with an input dynamic range of ADC. We thus have the following relationship: $3*(C_{in}/(C_{in}+C_{DAC}))=1.8$. Accordingly, the capacitance ratio of the input capacitor $C_{in}$ to the DAC capacitor $C_{DAC}$ is 1.5. In consideration of gain error, the capacitance ration should be reduced to some extent. In the exemplary embodiment, the capacitance ratio of the input capacitor $C_{in}$ to the DAC capacitor $C_{DAC}$ is in a range between 1.2 and 1.5 approximately. In a preferred embodiment, the capacitance ratio of the input capacitor $C_{in}$ to the DAC capacitor $C_{DAC}$ is 1.38 approximately. If a voltage swing of the input signal Vip is 3 volts, a voltage swing to the input node of the comparator 11 may therefore be 1.74 volts ($=3*(1.38/1.38+1)$).

Figure 3:
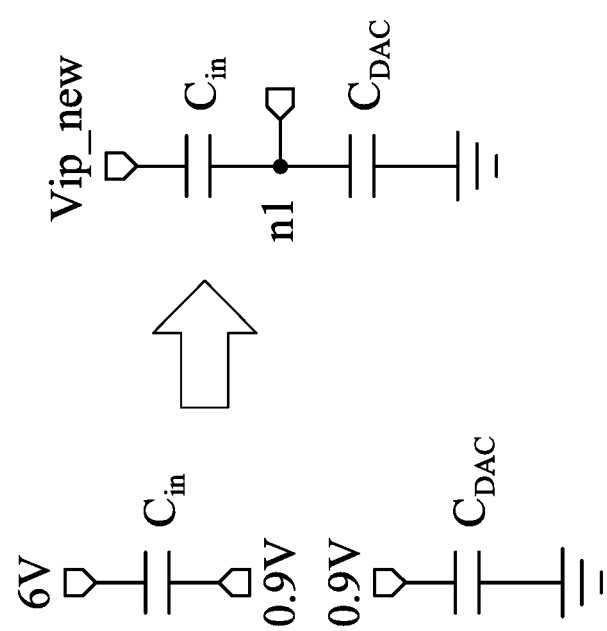
FIG. 3 shows equivalent circuits in hold phase and sampling phase respectively.

FIG. 3 shows equivalent circuits in hold phase and sampling phase respectively, where Vip_new represents a new input signal at the second end of the input capacitor $C_{in}$. According to the interfacing circuit 100 of the embodiment, the charges stored in the input capacitor $C_{in}$ and the DAC capacitor $C_{DAC}$ in hold phase are re-distributed in sampling phase. Suppose the new input signal Vip_new is 5 volts (i.e., $\Delta V=-1(=5-6)$) and the capacitance ratio of the input capacitor $C_{in}$ to the DAC capacitor $C_{DAC}$ is 1.5. After charge re-distribution, the voltage at the DAC node n1 will become 0.3 ($=0.9+\Delta V*(1.5/(1.5+1))=0.9+(-1)*0.6$).

Figure 4:
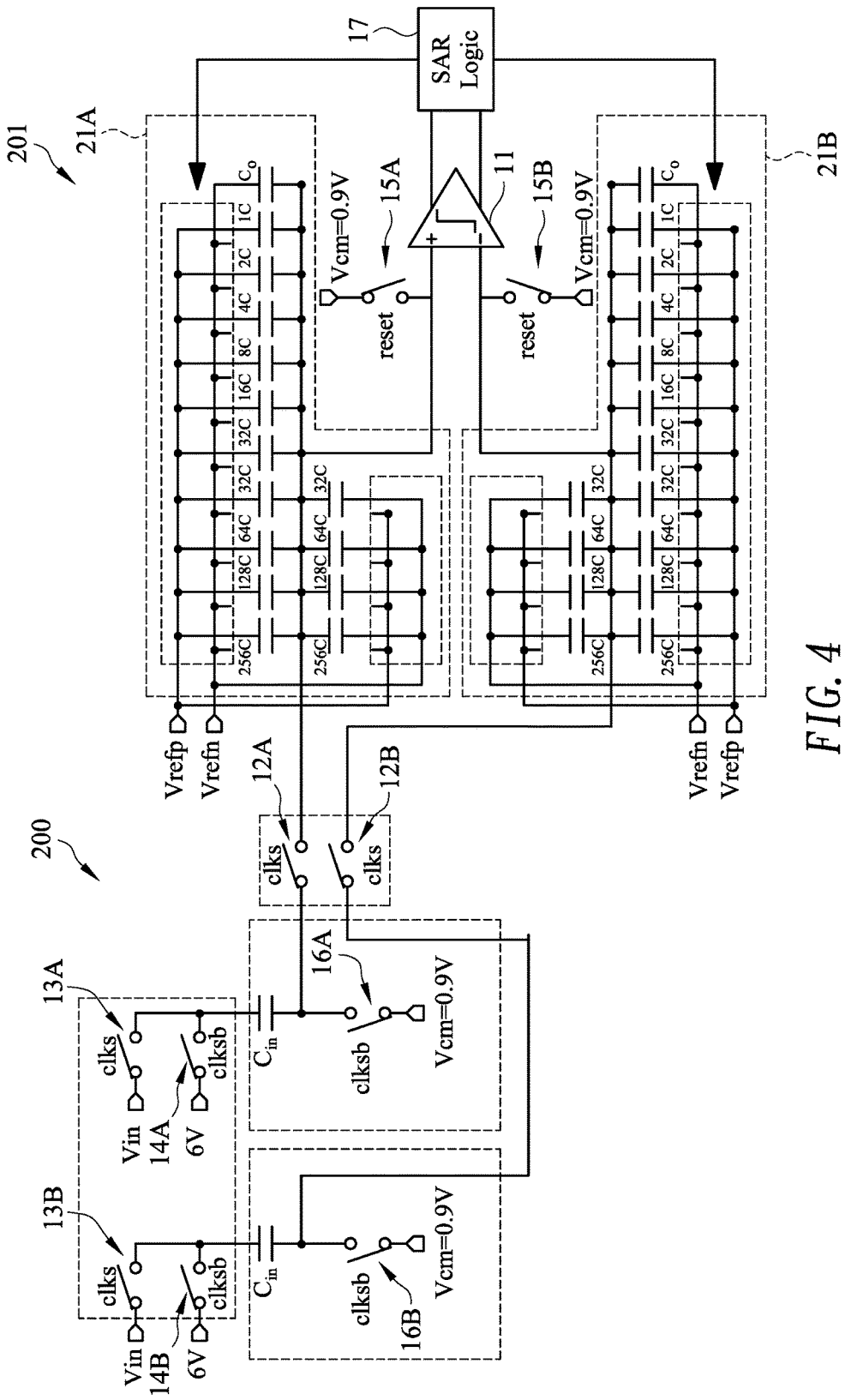
FIG. 4 shows a circuit diagram illustrated of an interfacing circuit adaptable to a successive approximation register (SAR) analog-to-digital converter (ADC) according to another embodiment of the present invention.

FIG. 4 shows a circuit diagram illustrated of an interfacing circuit 200 adaptable to a successive approximation register (SAR) analog-to-digital converter (ADC) 201 without using a programmable gain amplifier, according to another embodiment of the present invention. In the embodiment, a differential architecture is demonstrated.

In the embodiment, the SAR ADC 201 may include a first capacitor DAC 21A that is electrically coupled between a first S/H switch 12A and a first input end (e.g., a positive input end) of the comparator 11, and a second capacitor DAC 21B that is electrically coupled between a second S/H switch 12B and a second input end (e.g., a negative input end) of the comparator 11. Specifically, the first capacitor DAC 21A may include an array of individually switchable capacitors, and the second capacitor DAC 21B may include an array of individually switchable capacitors. To be more elaborate, the first capacitor DAC 21A or the second capacitor DAC 21B may be composed of a splitting monotonic part (e.g., capacitor pairs such as 32C to 256C) and a monotonic part (e.g., single capacitors such as 1C to 32C).

In the embodiment, the first S/H switch 12A, the first input switch 13A, the first hold switch 14A, the first reset switch 15A and the first front switch 16A constitute a first interfacing circuit, and the second S/H switch 12B, the second input switch 13B, the second hold switch 14B, the second reset switch 15B and the second front switch 16B constitute a second interfacing circuit. The first/second S/H switch 12A/12B, the first/second input switch 13A/13B, the first/second hold switch 14A/14B, the first/second reset switch 15A/15B and the first/second front switch 16A/16B of the interfacing circuit 200 are connected in the same manner as illustrated in FIG. 1A.

The SAR ADC 201 of the embodiment may include a SAR logic circuit 17 that controls switching of the capacitors array of the first capacitor DAC 21A and the capacitors array of the second capacitor DAC 21B, according to a result of the comparator 11.

Although specific embodiments have been illustrated and described, it will be appreciated by those skilled in the art that various modifications may be made without departing from the scope of the present invention, which is intended to be limited solely by the appended claims.

What is claimed is:

1. An interfacing circuit adaptable to an analog-to-digital converter (ADC), the interfacing circuit comprising:
   a sample and hold (S/H) circuit;
   an input switch;
   an input capacitor with a first end connected to an input end of a comparator of the ADC via the S/H circuit, and with a second end connected to receive an input signal via the input switch;
   a hold switch connected between the second end of the input capacitor and an original common-mode voltage;
   a reset switch connected between the input end of the comparator and a target common-mode voltage; and
   a front switch connected between the first end of the input capacitor and the target common-mode voltage.

2. The interfacing circuit of claim 1, wherein the S/H circuit comprises an S/H switch.

3. The interfacing circuit of claim 1, wherein the S/H switch and the input switch are controllably closed in sampling phase; and the hold switch, the reset switch and the front switch are controllably open in sampling phase.

4. The interfacing circuit of claim 3, which constitutes a low-pass filtering circuit in sampling phase.

5. The interfacing circuit of claim 3, wherein the S/H switch and the input switch are controllably open in hold phase; the hold switch and the front switch are controllably closed in hold phase; and the reset switch is controllably closed when the comparator finishes comparison at end of hold phase.

6. The interfacing circuit of claim 5, wherein the S/H switch is controllably closed before the input switch is closed, and the S/H switch is controllably open before the input switch is open.

7. The interfacing circuit of claim 5, wherein charges stored in the input capacitor and a DAC capacitor connected to the input end of the comparator in hold phase are re-distributed in sampling phase.

8. The interfacing circuit of claim 1, wherein a capacitance ratio of the input capacitor to a DAC capacitor connected to the input end of the comparator is in a range between 1.2 and 1.5 approximately.

9. The interfacing circuit of claim 1, comprising no programmable gain amplifiers.

10. The interfacing circuit of claim 1, comprising no high-voltage devices.

11. An analog-to-digital converter (ADC), comprising:
    a comparator;
    a first capacitor digital-to-analog converter (DAC) electrically connected to a first input end of the comparator;
    a second capacitor DAC electrically connected to a second input end of the comparator;
    a logic circuit that controls the first capacitor DAC and the second capacitor DAC according to a result of the comparator;
    a first interfacing circuit electrically connected to the first input end of the comparator; and
    a second interfacing circuit electrically connected to the second input end of the comparator;
    wherein the first interfacing circuit or the second interfacing circuit comprises:
      a sample and hold (S/H) switch;
      an input switch;
      an input capacitor with a first end connected to the first input end or the second input end of the comparator via the S/H switch, and with a second end connected to receive an input signal via the input switch;
      a hold switch connected between the second end of the input capacitor and an original common-mode voltage;
      a reset switch connected between the first input end or the second input end of the comparator and a target common-mode voltage; and
      a front switch connected between the first end of the input capacitor and the target common-mode voltage.

12. The ADC of claim 11, comprising a successive approximation register ADC.

13. The ADC of claim 11, wherein the first capacitor DAC or the second capacitor DAC comprises an array of individually switchable capacitors, switching of which is controlled by the logic circuit.

14. The ADC of claim 11, wherein the S/H switch and the input switch are controllably closed in sampling phase; and the hold switch, the reset switch and the front switch are controllably open in sampling phase.

15. The ADC of claim 14, wherein the first interfacing circuit and the second interfacing circuit constitute a low-pass filtering circuit in sampling phase.

16. The ADC of claim 14, wherein the S/H switch and the input switch are controllably open in hold phase; the hold switch and the front switch are controllably closed in hold phase; and the reset switch is controllably closed when the comparator finishes comparison at end of hold phase.

17. The ADC of claim 16, wherein the S/H switch is controllably closed before the input switch is closed, and the S/H switch is controllably open before the input switch is open.

18. The ADC of claim 16, wherein charges stored in the input capacitor, the first capacitor DAC and the second capacitor DAC in hold phase are re-distributed in sampling phase.

19. The ADC of claim 11, wherein a capacitance ratio of the input capacitor to the first capacitor DAC or the second capacitor DAC is in a range between 1.2 and 1.5 approximately.

20. The ADC of claim 11, comprising neither programmable gain amplifiers nor high-voltage devices.

* * * * *